United States Patent
Ma et al.

(10) Patent No.: US 7,536,614 B1
(45) Date of Patent: May 19, 2009

(54) BUILT-IN-REDUNDANCY ANALYSIS USING RAM

(75) Inventors: Siyad Chih-Hua Ma, Palo Alto, CA (US); Chao-Wen Iseng, Sunnyvale, CA (US)

(73) Assignee: Integrated Device Technology, Inc, San Jose, CA (US)

( * ) Notice: Subject to any disclaimer, the term of this patent is extended or adjusted under 35 U.S.C. 154(b) by 378 days.

(21) Appl. No.: 11/427,322

(22) Filed: Jun. 28, 2006

(51) Int. Cl.
*G11C 29/00* (2006.01)

(52) U.S. Cl. .................. 714/723; 714/718; 714/733; 714/5; 714/7; 714/54; 714/710; 714/711; 714/719; 365/200; 365/201

(58) Field of Classification Search ............... None
See application file for complete search history.

(56) References Cited

U.S. PATENT DOCUMENTS

| | | | |
|---|---|---|---|
| 5,987,632 A * | 11/1999 | Irrinki et al. ............... | 714/711 |
| 6,067,262 A * | 5/2000 | Irrinki et al. ............... | 365/201 |
| 6,304,989 B1 * | 10/2001 | Kraus et al. ................ | 714/733 |
| 6,408,401 B1 * | 6/2002 | Bhavsar et al. ............. | 714/7 |
| 6,751,760 B2 | 6/2004 | Tseng | |
| 6,785,852 B2 | 8/2004 | Okamoto | |
| 6,940,766 B2 * | 9/2005 | Konuk et al. ............... | 365/200 |
| 7,006,394 B2 | 2/2006 | Cowles | |
| 7,027,338 B2 | 4/2006 | Lee | |
| 7,031,217 B2 | 4/2006 | Hiraki | |
| 7,046,560 B2 | 5/2006 | Ayyapureddi | |
| 7,107,493 B2 * | 9/2006 | Nguyen et al. ............. | 714/42 |
| 2003/0097626 A1 | 5/2003 | Tseng | |
| 2003/0206470 A1 * | 11/2003 | Leader et al. .............. | 365/201 |
| 2004/0210803 A1 | 10/2004 | Cheng | |
| 2006/0161803 A1 * | 7/2006 | Andreev et al. ............ | 714/5 |
| 2007/0288807 A1 * | 12/2007 | Wu et al. .................... | 714/718 |
| 2008/0165599 A1 * | 7/2008 | Gorman ...................... | 365/200 |
| 2008/0178053 A1 * | 7/2008 | Gorman et al. ............. | 714/718 |

OTHER PUBLICATIONS

"A Built-In Self-Repair Scheme for Semiconductor Memories with 2-D Redundancy" Jin-Fu Li, Jen-Chieh Yeh, Rei-Fu Huang, Chen-Wen Hu, Peir-Yuan Tsai, Archer Hsu and Eugene Chow, ITC International Test Conference, IEEE, Paper 14.3, pp. 393-402.
"Memory Built-In Self-Repair Using Redundant Words" Volker Schober, Steffen Paul and Oliver Picot, ITC International Test Conference, IEEE, Paper 14.2, pp. 995-1001.

* cited by examiner

*Primary Examiner*—John P Trimmings
(74) *Attorney, Agent, or Firm*—Kenneth Glass; Glass & Associates

(57) ABSTRACT

A method for testing memory in an integrated circuit device is disclosed. The method includes executing a test routine in a portion of the memory at a speed sufficient to fully test the memory cells, identifying faulty memory cells in the tested portion of the memory; writing an error map in another portion of the memory, the error map indicating the location of faulty memory cells found in the tested portion and, after executing the test routine and writing the error map, repairing at least some of the faulty memory cells using the error map. Once one portion of memory is tested, another portion is tested and a prior tested portion is used to write a new error map. Repairing, by analyzing the error map, is done at a slower speed than required for memory testing, allowing the use of a smaller logic section in the integrated circuit.

24 Claims, 7 Drawing Sheets

BUILT-IN-REDUNDANCY ANALYSIS USING RAM

BACKGROUND OF THE INVENTION

In the production of relatively simple integrated circuit devices, such as RAM chips or simple logic arrays, quality control during testing is achieved by discarding chips that fail post-fabrication testing. Very complex integrated circuit devices, such as high-order controllers, systems-on-a-chip (SOC), and other devices, however, can be too expensive to throw away.

Furthermore, as complex devices get faster and their characteristic feature sizes get smaller, the probability of the occurrence of errors increases, even in the most rigorous of manufacturing environments. Thus testing becomes an ever more important consideration in the progression of design to device to product.

Built-in Self Test (BIST) is the technique of designing additional hardware and software features into integrated circuits to allow them to perform self-testing. Built-in self-testing means that integrated circuits can test their operation using their own circuits, reducing their dependence on expensive external automated test equipment (ATE). Built-in-self-testing can work closely with built-in-repair-analysis (BIRA), which can, in many instances, repair parts of integrated circuits that fail built-in-self-test, often by readdressing portions of an element to substitute a redundant element for one that fails testing.

Built-in Self Test is also commonly used for testing of circuits that have no direct connections to external pins, such as embedded memories used internally by various devices. Embedded memories are particularly amenable to testing and repair regimens because of the repetitive nature of rows and columns of memory cell arrays. Embedded static Ram (SRAM) devices require especially rigorous testing, often not exhibiting errors unless fully stressed at speeds commensurate with normal operation.

It is noted also that modern embedded memory can contain many millions of memory cells and the loss of any memory cell can be detrimental to the operation of the integrated circuit. Furthermore, the manufacture of complex integrated circuit devices is expensive and time consuming. With millions of memory cells, there is a likelihood that one or more memory cells will fail testing. Instead of replacing an entire integrated circuit, it is often more expedient to build in a means of repairing memory.

With the increasing complexity of highly integrated circuit chips and the need to provide more rigorous testing logic, the chip space, or real estate, devoted to built-in-self-test and built-in-repair-analysis logic sections becomes large and costly. In devices which have relatively large embedded memories designed into the chip, the testing and repair logic can take up large amounts of chip area real estate.

What is needed, then, is a built-in means of testing embedded memory under high-stress conditions, identifying faulty memory cells, and repairing such memory. Such means should be designed into the integrated circuit and not take up too much "real estate", or surface area.

SUMMARY OF THE INVENTION

A novel method for testing and repairing embedded memory is presented herein. The method fully tests embedded memory cells at characteristic memory operating speeds, but analyzes the results of testing and provides repair at slower speeds, and does not require the computing power to analyze and repair at full testing speeds, thus saving design effort and valuable chip space.

A method for testing memory in an integrated circuit device is disclosed. The method includes executing a test routine in a portion of the memory at a speed sufficient to fully test the memory cells, identifying faulty memory cells in the tested portion of the memory; writing an error map in another portion of the memory, the error map indicating the location of faulty memory cells found in the tested portion and, after executing the test routine and writing the error map, repairing at least some of the faulty memory cells using the error map. Once one portion of memory is tested, another memory portion is tested and a prior tested portion is used to write a new error map. Repairing, by analyzing the error map, is done at a slower speed than required for memory testing, allowing the use of a smaller logic section in the integrated circuit.

These and other objects and advantages of the present invention will become obvious to those of ordinary skill in the art after having read the following detailed description of the preferred embodiments that are illustrated in the various drawing figures.

DETAILED DESCRIPTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it should be understood by one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent by reference to the Figures.

Figure 1:
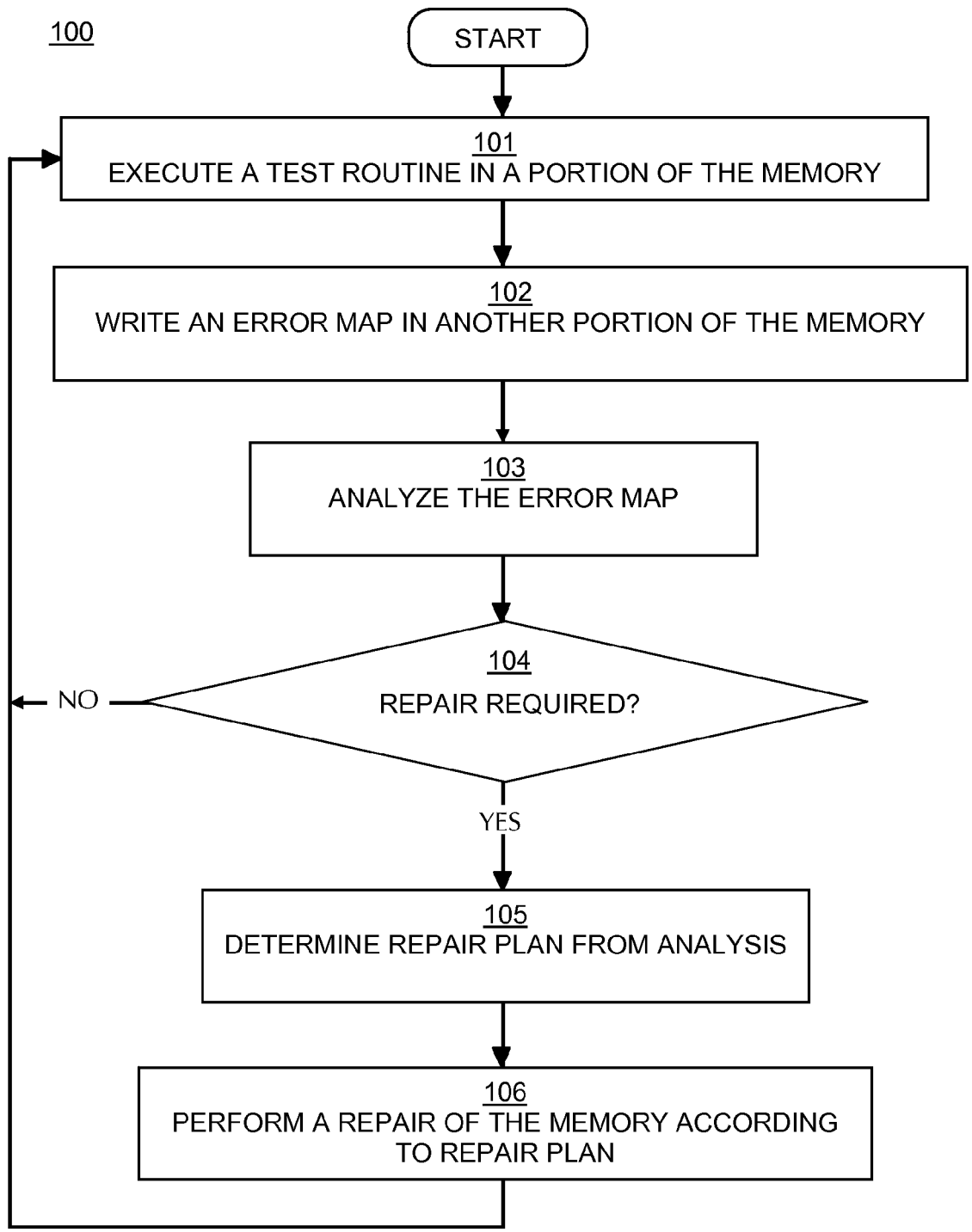
FIG. 1 illustrates a method for testing and repairing memory in an integrated circuit device in accordance with an embodiment of the present invention.

FIG. 1 illustrates a method for testing memory in an integrated circuit device in accordance with an embodiment of the present invention. Method 100 starts with the execution of a test routine 101 on a portion of a memory device to be tested. In this embodiment of the present invention, the tested memory is an embedded memory in a complex integrated circuit, such as a PCI Express bus switch. In another embodiment, the memory is embedded in a system-on-chip (SOC). In other embodiments, the tested memory is embedded in other types of complex devices.

It is noted here that memory is typically designed into integrated circuits in logical memory blocks, with each block featuring an array of rows and columns of memory cells. Such memory blocks are often similar in layout if not identical.

In one embodiment of the present invention, the similarity of memory blocks is exploited by testing one block while storing a map of faulty memory cells discovered during the testing on a similar or identical block.

The test executed at step 101 is performed at a high-speed so as to fully stress the memory cells being tested. In one embodiment testing 101 is conducted at representative memory operation speeds. In another embodiment, the test is performed at the average read/write speed for the device, or at some other high-speed that is sufficiently close to the expected memory operation speed. It is noted here that many memory cell faults are only discovered when the memory is stressed at high write and read speeds. Accordingly, testing 101 is sufficiently fast such that faulty memory cells can be identified.

Figure 2:
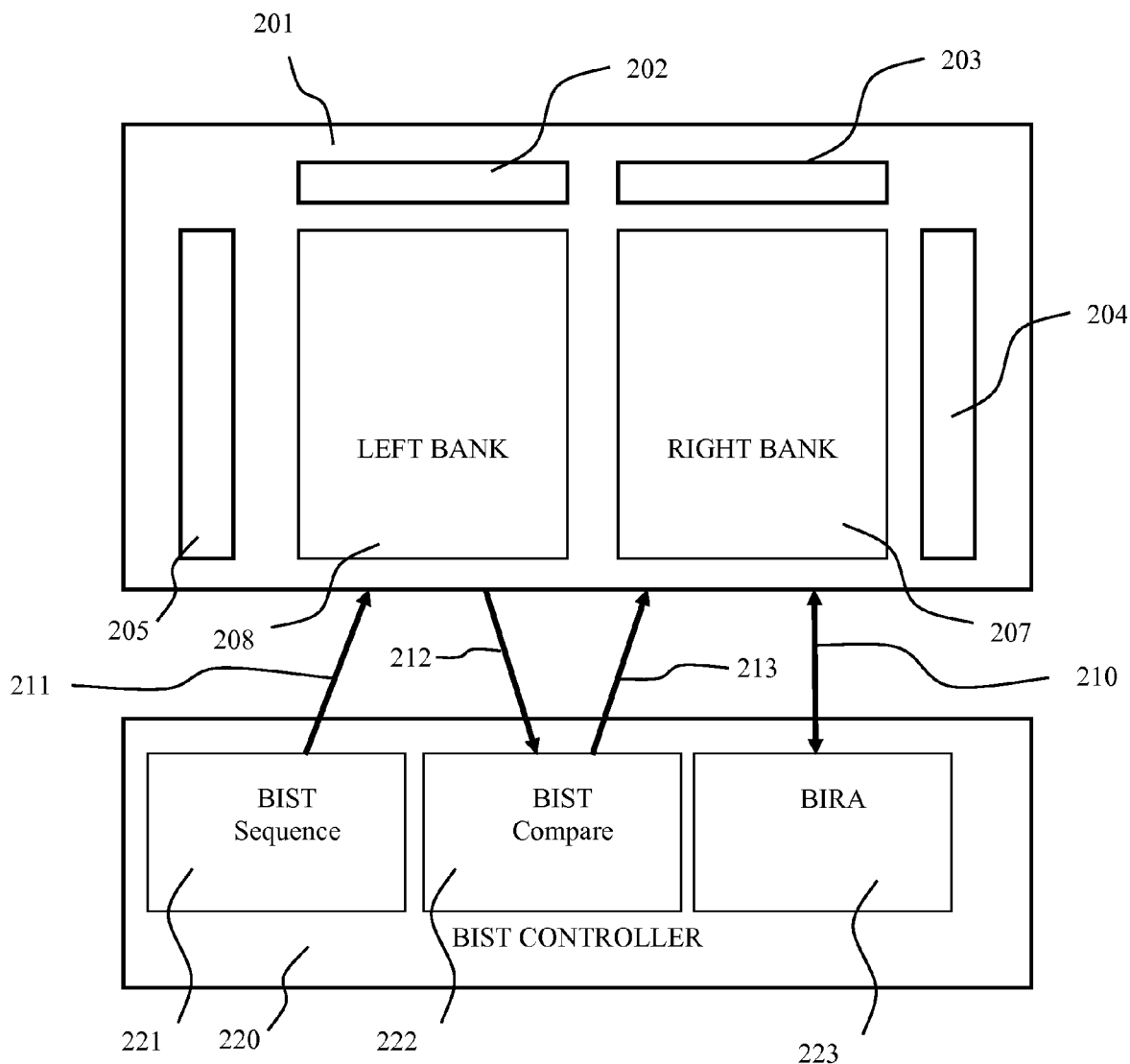
FIG. 2 illustrates a block diagram of built-in-self-test of embedded memory in an integrated circuit in accordance with an embodiment of the present invention.

FIG. 2 shows an integrated circuit device 200 that includes a memory section 201 and a built-in-self-test (BIST) controller 220. In the present embodiment built-in-self-test (BIST) controller 220 includes built-in-self-test sequence logic 221, built-in-self-test compare logic 222 and built-in-repair-analysis logic 223. In the present embodiment built-in self-test sequence logic 221 and built-in-self-test compare logic block 222 are operable to perform the testing of step 101.

Memory section 201 includes a left bank 208 and a right bank 207. The use of the terms left and right, it is noted, are used herein solely to illustrate the concepts presented in this description. The terms are intended to indicate two highly similar blocks of memory whose addressing is closely related but which are not necessarily located to the left or right of each other or any other specific item.

It is noted here that embedded memory is often physically configured in two mirror image banks. The two banks are often equal in size and are located on either side of a memory addressing bus. By implementing memory in this fashion, the longest addressing traces are minimized in length, providing the minimum in time-delay-causing lead capacitance. In one embodiment of the present invention, such a mirror-image configuration is exploited by using the opposing memory bank to hold the error map referred to above.

It is noted here that, integrated circuit 200 includes onboard logic that performs a variety of different functions. Such logic is typically in the form of firmware, meaning that the program for implementing a function is a designed-in part of the integrated circuit device 200. In one embodiment of the present invention, the programming is permanently a part of the design configuration. Whether permanent or otherwise, the logic that implements built-in-self-test and built-in-repair-analysis, in this embodiment of the present invention, is resident in the integrated circuit device.

In the embodiment shown in FIG. 2, the built-in-self-test logic is resident in built-in-self-test controller 220 in the form of built-in-self-test sequence 221 and built-in-self-test compare circuitry 222. In one embodiment of the present invention, built-in-self-test sequence 221 performs step 101.

Referring back to FIG. 1, an error map is written 102 that indicates any faulty cells found in test 101. In the present embodiment, test 101 and writing of the error map 102 are performed contemporaneously, with writes to the error map performed as errors are discovered. Accordingly, both steps are performed at a high-speed such as representative memory operation speeds, average read/write speed for the device, or at some other high-speed that is sufficient to identify memory errors.

In the following exemplary embodiment, built-in-self-test sequence 221 performs step 101 by testing, as indicated by arrow 211, left memory bank 208. As the built-in-self-test is run, read operations are compared 212 with writes in built-in-self-test compare logic block 222. Error indications are then written, as shown by arrow 213, to the right memory bank 207 in the form of an error map.

The test can use any of a number of different test routines. In one embodiment the test is a modified March algorithm. A March algorithm allows a complete memory test, at high speed, that is fully automated. In a typical implementation of a March algorithm, a write cycle follows a read cycle. In this embodiment of the present invention, the write cycle is used to store failure information.

In one embodiment of the present invention, faulty memory cells are identified, during step 101, by performing a modified March-LR algorithm to write to memory cells then read from them. Using a March LR process enables a test of each cell in a memory array that progresses through the array's addressing scheme. In another embodiment, however, a different testing routine is used that implements a different testing algorithm.

In one embodiment, built-in-self-test sequence 221 performs a March LR test routine that consists of writing a logic state to a set of memory cells, reading the logic state of the same cells more than once, writing a different logic state to the tested cells, then reading the logic state of an adjacent set of memory cells. Coding for a March LR test, implemented in hardware in this embodiment of the present invention, can be written as:

{(w0); d(r0, w1); u(r1, w0, r0, w1); u(r1, w0); u(r0, w1, r1, w0); u(r0)} and coding for a modified March LR test can be written as: {(w0); d(r0, w1); u(r1, w0, r0, w1); u(r1, w0); u(r0, w1, r1, w0); u(r0, w0)}, where "u" refers to a step up in addressing and "d" refers to a step down in addressing and where the final write operation is used to store back failure information as it is encountered. By iteratively running such commands, a modified March LR algorithm can test a bank of memory at speed and store a map of failures in another bank of memory.

Referring again to FIG. 2, the encoded March LR algorithm of this embodiment, resident in built-in-self-test sequence logic block 221, is run at speed, 211, in the memory block under test (e.g. memory block 208). As the built-in-self-test is run, read operations are compared 212 with writes in built-in-self-test compare logic block 222. Error indications are then written, as shown by arrow 213, to the right memory bank 207 in the form of an error map.

The write process of step 102 in FIG. 1, in this embodiment of the present invention, writes an error map to a memory bank not being tested, such as right memory bank 207 (in FIG.

2) for example. Right memory bank 207 is shown here as being identical to the memory bank being tested, left memory bank 208. However, in another embodiment of the present invention, the memory bank to which the error map is written to is a mirror image of the tested memory bank. In yet another embodiment, the memory bank to which the error map is written is not identical but is sufficiently large to provide space for a one-for-one map of the tested memory bank. In any case, the memory map includes a flagged cell corresponding to each faulty cell identified during testing 101.

Referring still FIG. 1, the error map is analyzed (step 103). In the present embodiment, the error map written in step 102 is analyzed to identify those memory cells found in step 101 to be faulty. Analyzing, in this embodiment, includes reading the error map to determine the existence and the location of faulty cells. In the present embodiment steps 101 and 102 are performed first, and steps 103-106 are performed after steps 101 and 102 have been completed.

Referring now to step 104, if faulty cells are discovered in testing 101 and flagged in the error map written at step 102, a repair plan is determined as shown by steps 104-105. However, when the analysis of step 103 finds that the error map does not indicate any faulty cells, no repair plan is determined 105 and no repair 106 is performed.

Repair of faulty memory cells, in this embodiment of the present invention, denotes the substitution of redundant memory cells in place of faulty cells by fusing links in the addressing of the memory arrays. In the present embodiment, when the analysis of step 103 finds that the error map does not indicate any faulty cells, a different plan is performed to close off fusible links that address the unnecessary redundant memory cells. In another embodiment, an external device such as a laser is used to fuse links. In the embodiment shown in FIG. 2, built-in-repair-analysis logic 223 is operable to perform the analysis of step 103, determine whether repair is required 104, and determine a repair plan 105.

In the present embodiment, the repair plan is a plan of readdressing, by fusing links, the redundant memory to achieve a fully functional memory. After readdressing, the memory block 201 functions as if it were a contiguous unit, even though one or more of its rows or columns have been logically replaced in the addressing order.

In one embodiment of the present invention, a repair plan is used that attempts to replace all faulty memory cells. In cases where there is more redundant memory available than is necessary, it is noted, the repair does not have to be an optimal solution, only an effective one. In one embodiment, if more faulty cells exist than there is redundant memory to replace, the memory is deemed irreparable and the chip is discarded. In another embodiment, however, if more faulty cells exist than there is redundant memory to replace, a repair plan is used that replaces as many faulty cells as possible and the device can be marked as being one with degraded performance.

After the repair plan is formed, the memory is repaired 106. Repair, as the term is used in this description and as discussed above, generally means the substitution of redundant memory, in the form of redundant rows or redundant columns, into the addressing of the affected memory block. However, in another embodiment, repair can be by other means. The repair can be performed automatically, by built-in-self-repair (BISR) or some other function under the guidance of built-in-repair-analysis logic 223. It is noted that built-in-repair-analysis logic 223 can be performed using external devices and/or equipment, meaning that built-in-repair-analysis 223 can be resident in a device external to the memory device.

In the embodiment shown in FIG. 2, memory 201 includes dedicated redundant memory cell arrays 202, 203, 204 and 205. Redundant memory cell arrays 202 and 203 are presented here as redundant memory word rows and redundant memory arrays 204 and 205 are presented as redundant memory columns. It is noted again that the concept of memory row and column are logical concepts, referring to the use and addressing of memory locations. The memory cells themselves are not limited to the physical relationships that "row" and "column" imply.

Redundant memory cell arrays 202, 203, 204 and 205 are designed into embedded memory 201 for the purpose of post-manufacture repair of memory that fails built-in-test. As described previously, in the present embodiment, repair of memory (step 106) is the substitution of good memory cells (e.g., redundant memory cells 202, 205) in place of faulty memory cells. Embedded memory 201 is designed to have its addressing connections set after built-in testing determines the validity of the memory cells. In such testing, if a faulty cell is detected (step 101), addressing connections can be severed during repair (step 106) so as to substitute a row or column of good cells in place of the row or column containing the faulty cell. If no faulty cell is detected, then the addressing connections to the redundant rows and columns can be severed, making permanent the designed addressing scheme. In one embodiment, step 106 includes severing connections in integrated circuit 200 using an external device, such as a laser in a testing station, by internal means such high current melting of fusible links, or by other means. In embodiments in which addressing links are severed during repair, faulty cells, or the rows or columns containing faulty cells, are permanently removed from the addressable memory array. Functional memory cells are logically substituted into the addressing scheme.

It is noted that testing, step 101, finds the locations of faulty cells in the tested memory. Since embedded memory, such as is tested in this embodiment of the present invention, is often part of a complex and expensive integrated circuit device, repair of the memory is more desirable than replacement of the entire device. For this purpose, redundant memory cells, in the form of redundant rows and redundant columns, are designed into the layout of a complex chip device. Repair of faulty memory is then a matter of readdressing, as discussed above, a column or row containing a faulty cell to replace it logically with one of the redundant columns or rows.

In one embodiment of the present invention, the use of two similar or identical memory blocks allows testing of one block while writing an error map that indicates the errors found into the other block. Because the method of the present invention does not perform analysis at the same time as testing, embodiments of the present invention can fully stress the memory at high speeds. Yet, the analysis and repair of steps 103-106 can be accomplished at a slower pace than would be required to keep up with the at-speed memory test performed by built-in-self-test sequence 221, allowing for less complex testing logic. It is this off-line, non-contemporaneous, analysis that enables implementation of built-in-repair-analysis logic block 223 in a much smaller space than would otherwise be required, saving valuable space on a complex and crowded integrated circuit chip.

Figure 3:
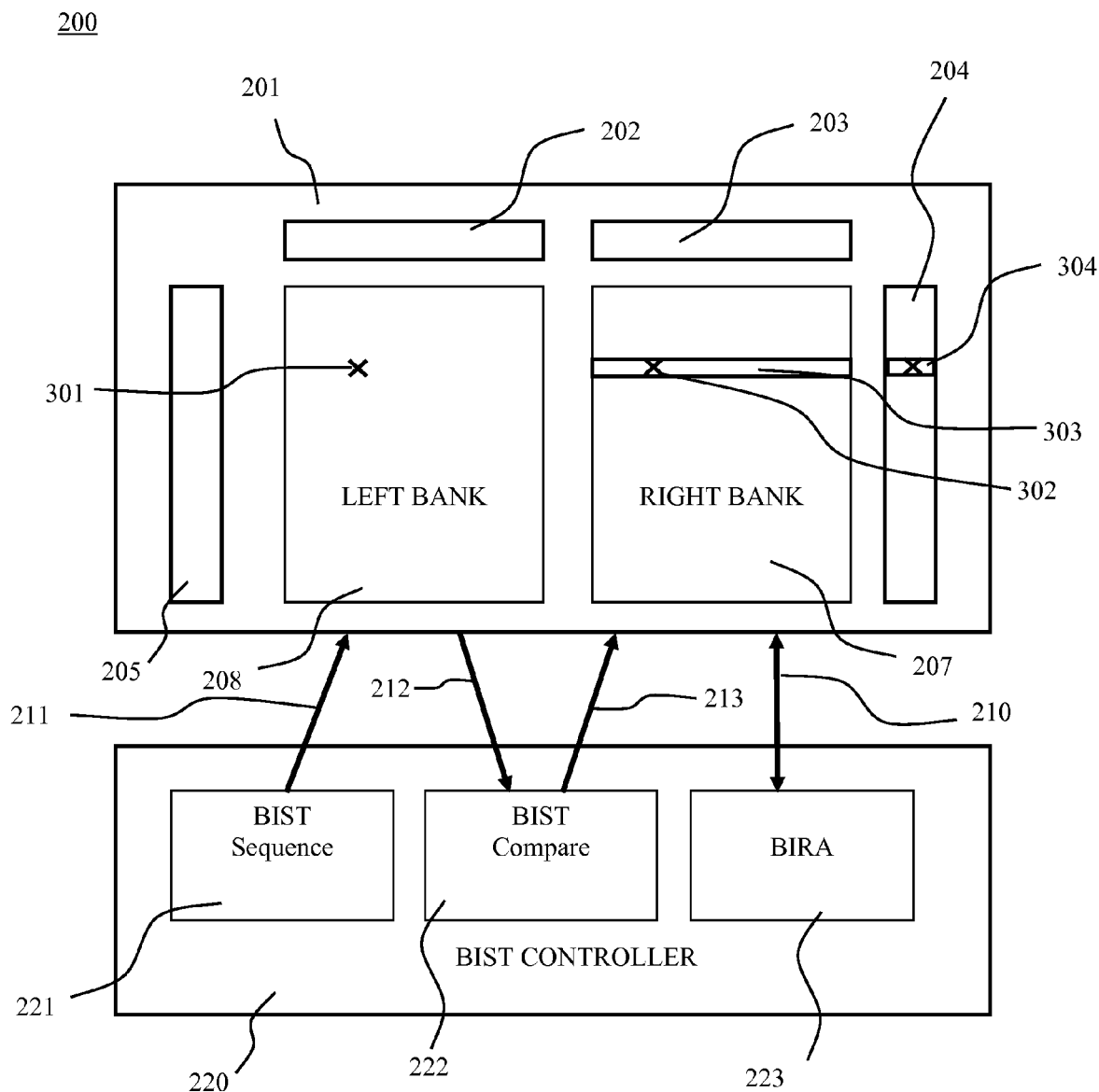
FIG. 3 illustrates a block diagram of an embedded memory in an integrated circuit with built-in-self-testing in which a faulty cell is flagged in an associated error map in accordance with an embodiment of the present invention.

FIG. 3 illustrates a technique for reducing the likelihood that an unflagged faulty cell in the memory bank into which the error map is written will disguise a flagging in the error map of a faulty cell. In FIG. 3, a faulty cell 301 found in testing of the memory bank under test 208 is flagged 302 in the error map written in the failure map bank 207. Logical row 303 in the error map memory bank is the memory row that contains the flagged bit 302 indicating the location of the error in the tested memory bank.

In this embodiment, a cell 304 in redundant column array 204, corresponding to flagged error map row 303, is also flagged upon the mapping of a bit fault. Flagging, it is noted, is the setting of a bit to a specific logic state. In effect, the redundant bit setting acts as a parity check on the flagged bit in the error map. With a parity bit set, even in the occurrence of the flagged bit being faulty and not yielding an error report when later queried by the built-in-repair-analysis logic, the flagging of a corresponding bit in the redundant column array indicates the fault. In this case, the corresponding row in the memory bank under test 208 will ultimately be replaced during repair by a row from redundant row array 202. In this way, possible errors in the memory bank used for the error map 207, even if undetected prior to testing of the second bank, do not inhibit repair of the memory bank under test.

Figure 4:
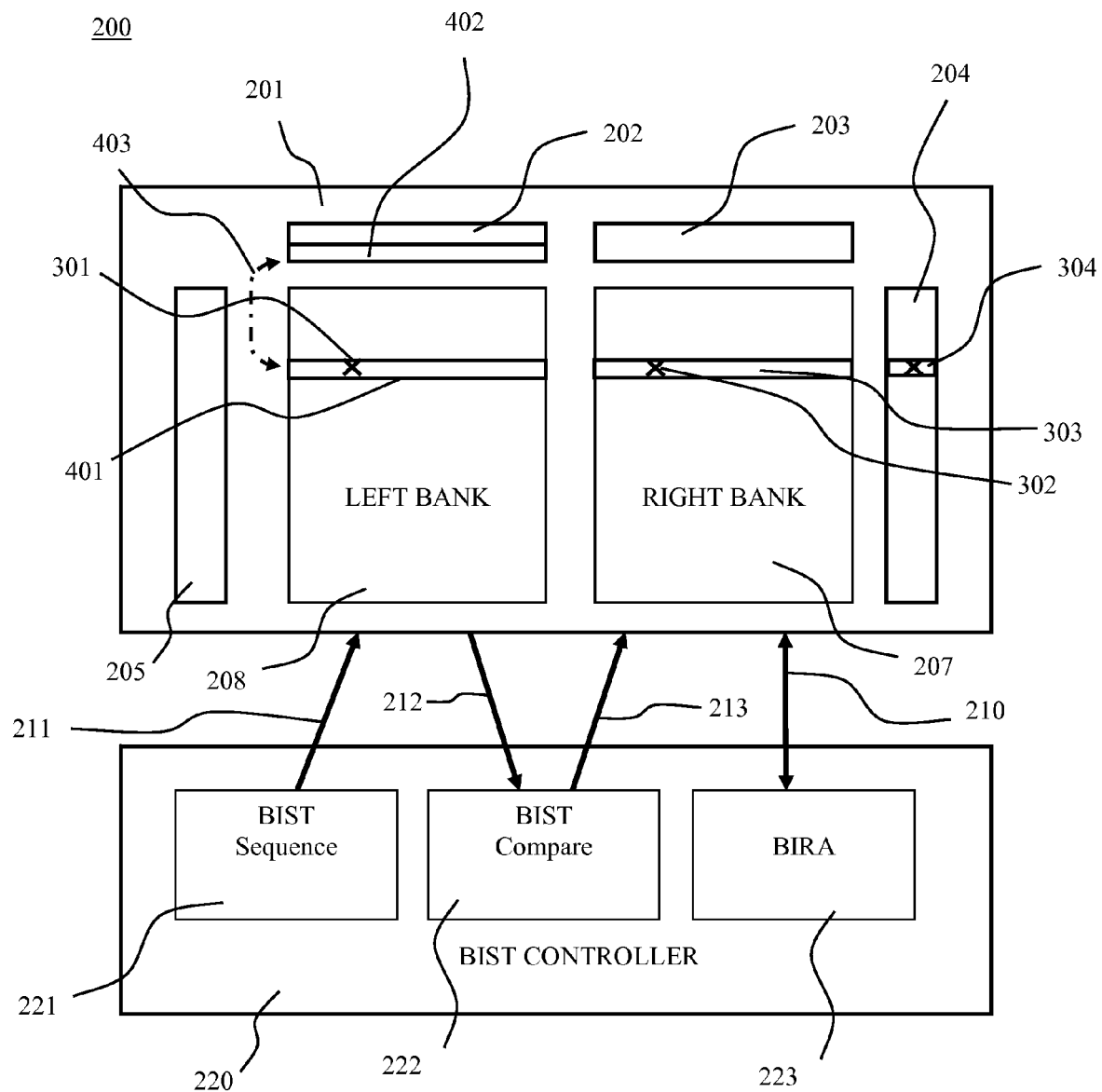
FIG. 4 illustrates a block diagram of an embedded memory in an integrated circuit in which a repair is effected by a redundant row substitution in accordance with an embodiment of the present invention.

FIG. 4 illustrates an exemplary faulty cell 301 in embedded memory 208 being tested in accordance with method 100 described above in reference to FIG. 1. In this embodiment, step 101 will identify memory cell 301 as being faulty. Accordingly, the error map written in memory bank 207 indicates an error flag 302 that corresponds to an error 301. In error map memory bank 207, row 303 is the logical memory row that contains the flagged cell. The corresponding row 401 in memory bank 208 being tested contains the memory cell 301 which failed the built-in-self-test. Analysis (103) of the error map, illustrated by arrow 210, performed by built-in-repair-analysis circuit 223, determines that an appropriate method of repair is the logical substitution 403 of a redundant row 402, from redundant row array 202, in place of row 401. The logical substitution 403, in this embodiment, is accomplished by severing designed-in links in the memory addressing scheme, as discussed previously. By logically substituting in a redundant row, the memory bank is enabled to seamlessly provide logically contiguous addressing of a reduced-error, if not error-free, memory.

It is noted again that logical substitution of redundant rows and columns is achieved by the severing, or cutting, of the excess address connections that are designed into a complex integrated circuit device. In one embodiment of the present invention, there are redundant addressing connections as well as redundant memory cells. In such a design, it is necessary to sever address connections to memory cells with errors in testing, or to such redundant cells if not needed to replace cells in error. However, in another embodiment of the present invention, another addressing scheme can be used and such severing can be avoided.

Figure 5:
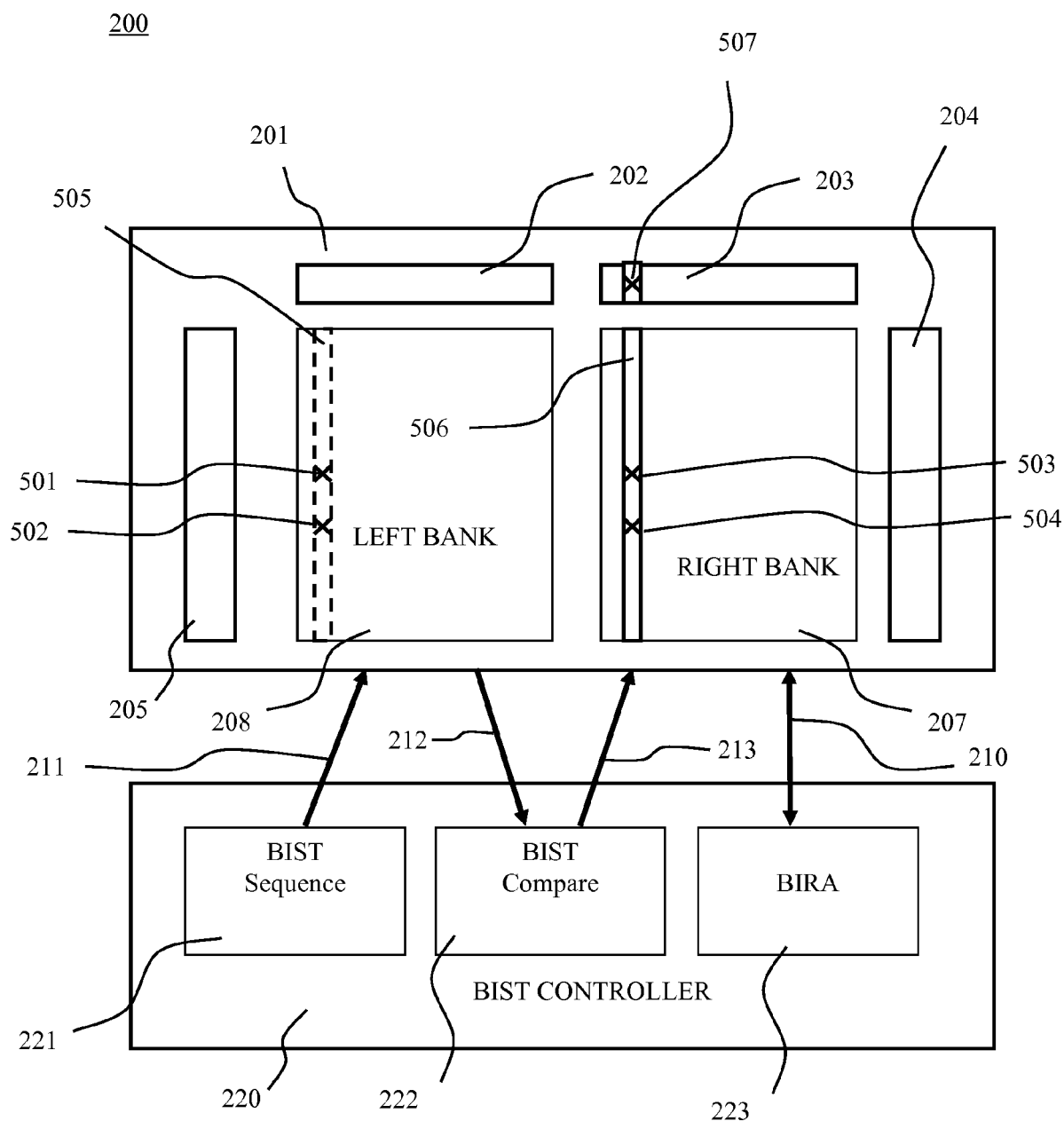
FIG. 5 illustrates a block diagram of a memory in an integrated circuit with built-in-self-testing in which a two faulty cells are flagged in the same column of an associated error map in accordance with an embodiment of the present invention.

Referring now to FIG. 5, another embodiment of the present invention is shown in which another indication of errors is produced by built-in-self-test. Here, two faulty cells have been discerned during built-in-self-test, 501 and 502, in the memory bank 208 being tested. The two faulty cells are identified and indicated as flags 503 and 504 in the error map written in memory bank 207. By coincidence, the two faulty cells 501 and 502 are in the same column 505.

In this illustration, the column 505 containing both of the faulty cells is identified and flagged by its corresponding column 506 in the error map. Additionally, a cell is flagged, 507, in the redundant row array 203 which is associated with error map memory bank 207. The cell in redundant row array 203 is flagged for the same reason as discussed above in reference to FIG. 3 in the flagging of a cell in redundant column array 204. Again, when memory bank 208 is fully tested, in this embodiment of the present invention, the error map is written in another memory bank 207, flagging faulty cells discovered in testing.

In one embodiment of the present invention, cells in both redundant column array 204 and redundant row array 203 are flagged on the writing of a faulty cell flag in the error map. The cell flagged in column array 204 corresponds to the logical row in the error map in memory bank 207 containing the cell flag and the cell flagged in row array 203 corresponds to the logical column in the error map containing the flag. By having both row and column of a faulty cell identified, a repair plan can be developed despite the failure of the error map memory bank to yield a flag when queried during built-in-repair-analysis.

Figure 6:
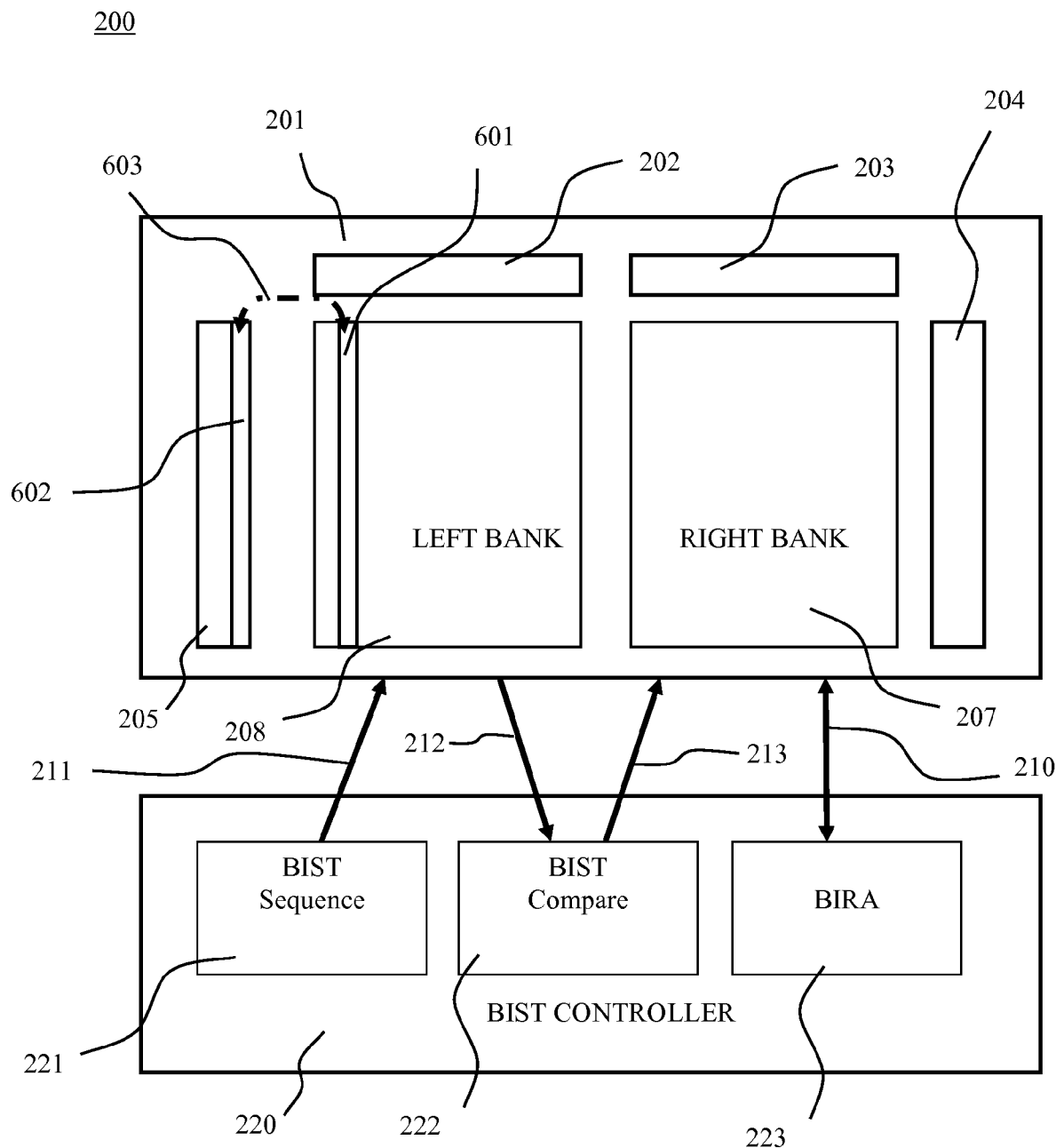
FIG. 6 illustrates a block diagram of an embedded memory in an integrated circuit in which a repair is effected by a redundant column substitution in accordance with an embodiment of the present invention.

FIG. 6 illustrates the repair of a memory bank in embedded memory 201 in which two cells identified as faulty are located in the same logical column. As identified in reference to FIG. 5 above, two cells in the same logical column are identified in memory bank 208. In this embodiment of the present invention, built-in-repair-analysis 223, when analyzing 210 the error map written into memory bank 207, has determined an appropriate repair approach. Here, the appropriate repair approach is the readdressing 603 of column 602, in redundant column array 205, in lieu of error-containing column 601 in memory bank 208.

In the present embodiment, semiconductor device 200 uses less valuable chip area because the built-in-self-test and repair tasks are divided. Built-in-self-test and built-in-repair-analysis occur at different times and different speeds. Again, built-in-self-test logic 221 operates at a speed sufficient to fully test and stress memory cells. Built-in-repair-analysis logic 223, however, can operate at a slower pace and non-contemporaneously with testing, thus allowing built-in-repair-analysis logic block 223 to occupy a smaller footprint than would otherwise be enabled.

It is noted again that, in this embodiment, analysis of the error map can take place at a time and a speed other than that of the high-speed, high-stress, testing of the memory bank under built-in-self-test. This non-synchronized analysis is enabled to be accomplished by a logic section substantially smaller than would be required for a synchronized, contemporaneous, analysis. In this way, a savings of integrated circuit chip space is realized.

Figure 7:
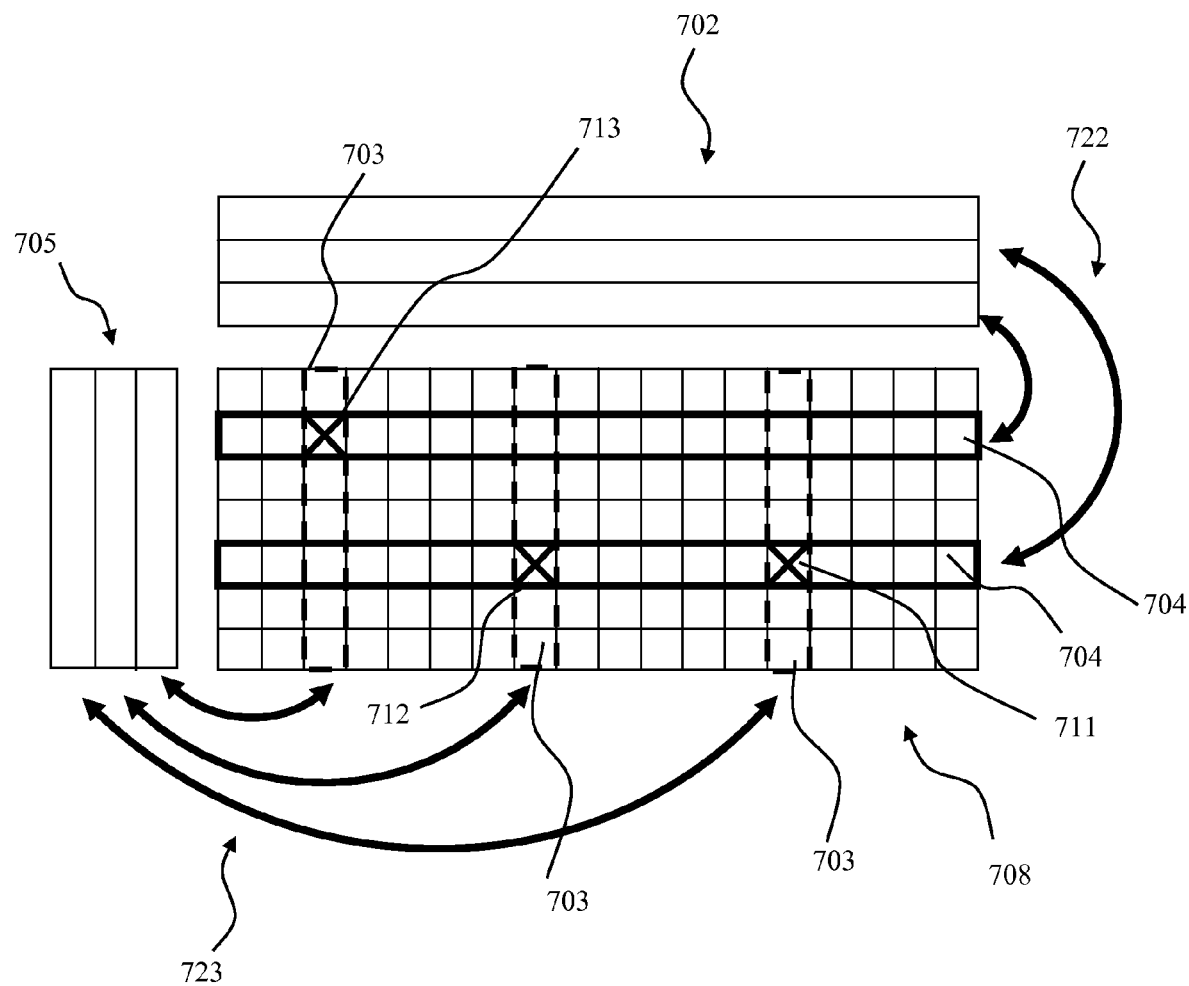
FIG. 7 illustrates repair of embedded memory by row and column substitution in an embedded memory in accordance with an embodiment of the present invention.

FIG. 7 illustrates a more detailed view of memory bank 208 and redundant memory cell arrays 202 and 205. Memory cell array 708 in FIG. 7 is shown as a part of memory bank 208, above. Redundant row array 702 is shown as a part of redundant row array 202, above, and redundant column array 705 is shown as a part of redundant column array 205, above.

In this example of built-in-self-testing of memory cell array 708, built-in-self-test has identified three faulty cells 711, 712, and 713. Faulty cells 711 and 712 are found in the same logical memory cell row 704. However, the three exemplary faulty memory cells are found in different logical memory cell columns. Again, the faulty cells are flagged to built-in-repair-analysis in the error map written in another memory bank.

During built-in-self-test of memory bank 202, the memory error map is written to the other memory bank, as illustrated above, that flags faulty memory cells discovered in the built-in-self-test. Subsequently, or contemporaneously but without the same need for speed, the error map is analyzed in built-in-repair-analysis and a repair is generated.

In FIG. 7, the error map indicates to built-in-repair-analysis the locations of faulty memory cells 711, 712, and 713. Redundant rows are available for repair in array 702 and redundant columns are available in array 705. During builtin-repair-analysis, it is determined that two redundant rows 704 can be readdressed 722 into the logical row order of memory bank 708 to replace the faulty cells. It is also determined that three columns 703 can be readdressed 723 to effect the same repair. In this embodiment of the present invention, either repair scheme can be employed. However, substituting rows into the memory bank row order requires only two readdressing operations whereas there are three required in order to substitute columns. In another embodiment of the present invention, both row and column substitution can occur in the same memory bank simultaneously.

It is noted that built-in-repair-analysis does not need to seek the most efficient repair plan in this embodiment. Any effective repair plan is workable as there is always a number of unused memory cells in any case, whether they are originally redundant cells or they are substituted out by readdressing.

A method for testing memory in an integrated circuit device, and an apparatus for its implementation, has been described. The method includes executing a test routine in a portion of the memory at a speed sufficient identify faulty memory cells, writing a map in another portion of the memory that indicates the identified faulty cells, analyzing the error map and determining a repair plan if the analyzing indicates that there are faulty cells, and performing a repair of the memory according to the plan. Each block of memory is tested and an equivalent block is used to write the error map. Once one block is tested and repaired, another block is tested and a new error map is written into the previously tested block. Analyzing by reference to the error map is done at a slower speed than required for memory testing, allowing the use of a smaller logic section in the integrated circuit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method for testing memory in an integrated circuit device, comprising:
   executing a test routine in a first portion of said memory, said test routine identifying faulty memory cells in said first portion of said memory;
   writing an error map in a second portion of said memory, said error map indicating the location of said faulty memory cells; and
   after said executing a test routine and said writing an error map, repairing at least some of said faulty memory cells using said error map when said error map indicates the presence of said faulty memory cells.

2. The method for testing memory described in claim 1, wherein said repairing said faulty memory cells comprises:
   analyzing said first portion of said memory by reference to said error map;
   determining a repair plan from said analyzing if said analyzing indicates that said first portion of said memory includes faulty memory cells; and
   performing a repair of said first portion of said memory according to said plan.

3. The method for testing memory described in claim 1, further comprising:
   executing said test routine in said second portion of said memory;
   writing an error map in said first portion of said memory, said error map indicating the location of said faulty memory cells;
   analyzing said memory by reference to said map;
   determining a repair plan from said analyzing if said analyzing indicates an error in said second portion of said memory; and
   performing a repair of said second portion of said memory according to said plan.

4. The method for testing memory described in claim 1, wherein said executing a test routine is performed at a speed consistent with the normal operation of said memory.

5. The method for testing memory described in claim 4, wherein said executing a test routine is performed by dedicated logic resident in said integrated circuit device.

6. The method for testing memory described in claim 4, wherein said analyzing said memory is performed by dedicated analysis logic resident in said integrated circuit device.

7. The method for testing memory described in claim 6, wherein said analyzing said memory is performed at a speed that is less than said speed consistent with the normal operating speed of said memory.

8. The method for testing memory described in claim 1, wherein said second portion of said memory is logically identical to said first portion of said memory.

9. The method for testing memory described in claim 1, wherein said performing a repair of said memory is accomplished by substituting a redundant memory column in said memory for a column in said memory containing a faulty memory cell.

10. The method for testing memory described in claim 1, wherein said performing a repair of said memory is performed by substituting a redundant memory row in said memory for a row in said memory containing a faulty memory cell.

11. The method for testing memory described in claim 1, wherein said performing a repair of said memory is accomplished by substituting a redundant memory column and a redundant memory row in said memory for a column and a row containing a faulty memory cell.

12. A circuit in an integrated circuit device for testing an array of memory cells comprising a first bank of memory cells and a second bank of memory cells in said integrated circuit device, comprising:
   a circuit electronically coupled to said array of memory cells and comprising logic for performing said testing of one of said first bank and said second bank of memory cells at a speed sufficient to fully stress the memory cells in said array and writing an error map to the other of said first bank and said second bank; and
   a circuit electronically coupled to said array of memory cells and comprising logic for repairing said array of memory cells.

13. The circuit described in claim 12 wherein said repairing said array of memory cells is operable to be performed after the completion of said testing said array of memory cells.

14. The circuit described in claim 12 wherein said logic for testing said array of memory cells comprises logic for writing an error map of the results of said testing into an array of memory cells not under test.

15. The circuit described in claim 12 wherein said logic for repairing said array of memory cells comprises logic for analyzing said map of said results of said testing.

16. The circuit described in claim 15 wherein said logic for repairing said array of memory cells is enabled to repair said array according to the results of analyzing said map of said results found.

17. The circuit described in claim 16 wherein said analyzing said map is accomplished independently of said testing of said array of memory cells.

18. The circuit described in claim 12 wherein said repairing said array of memory cells comprises changing addressing in said integrated circuit device to logically incorporate a redundant memory cell into said array of memory cells in place of a faulty memory cell.

19. An integrated circuit device, comprising:
- a first set of memory cells, said first set of memory cells being enabled to be logically addressed in said integrated circuit device and including a first bank of memory cells and a second bank of memory cells;
- a second set of memory cells, said second set of memory cells being enabled to be logically addressed in said integrated circuit device;
- a circuit comprising logic for performing a test of one of said first bank and said second bank of memory cells and writing an error map to the other of said first bank and said second bank of said first set of memory cells; and
- a circuit comprising logic for performing a repair analysis of the results of said test, wherein memory cells in said second set of memory cells are enabled to be logically incorporated into the addressing of said first set of memory cells so as to logically replace one or more memory cells in said first set of memory cells.

20. The integrated circuit device described in claim 19, wherein said circuit comprising logic for performing a test comprises a built-in-self-test controller.

21. The integrated circuit device described in claim 20, wherein said circuit comprising logic for performing a repair analysis of the results of said test is enabled to perform said analysis on an error map of said results written in a third set of memory cells.

22. The integrated circuit device described in claim 19, wherein said first set of memory cells is logically arrayed in rows and columns.

23. The integrated circuit device described in claim 19, wherein said second set of memory cells comprises a logical row of memory cells.

24. The integrated circuit device described in claim 19, wherein said second set of memory cells comprises a logical column of memory cells.

* * * * *